United States Patent
Avraham et al.

(10) Patent No.: US 10,372,539 B2
(45) Date of Patent: Aug. 6, 2019

(54) VARIABLE LENGTH CLDPC ENCODER AND METHOD OF OPERATION IN AN AUTONOMOUS VEHICLE

(71) Applicant: WESTERN DIGITAL TECHNOLOGIES, INC., San Jose, CA (US)

(72) Inventors: David Avraham, Even Yehuda (IL); Idan Goldenberg, Ramat Hasharon (IL); Alexander Bazarsky, Holon (IL); Eyal Sobol, Givat Shmuel (IL); Martin Booth, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 4 days.

(21) Appl. No.: 15/817,442

(22) Filed: Nov. 20, 2017

(65) Prior Publication Data
US 2019/0155687 A1    May 23, 2019

(51) Int. Cl.
*H03M 13/00* (2006.01)
*G06F 11/10* (2006.01)
(Continued)

(52) U.S. Cl.
CPC ...... *G06F 11/1076* (2013.01); *B60R 16/0232* (2013.01); *B60R 16/0239* (2013.01); *H03M 13/1154* (2013.01); *H03M 13/2906* (2013.01)

(58) Field of Classification Search
None
See application file for complete search history.

(56) References Cited

U.S. PATENT DOCUMENTS

| 5,600,663 A | * | 2/1997 | Ayanoglu | H03M 13/35 714/751 |
| 6,621,871 B2 | * | 9/2003 | Ross | H04L 1/005 375/262 |

(Continued)

FOREIGN PATENT DOCUMENTS

WO    2015191245 A1    12/2015

OTHER PUBLICATIONS

Costello et al., "Spatially Coupled Sparse Codes on Graphs: Theory and Practice," IEEE Communications Magazine, Jul. 2014, pp. 168-176.
(Continued)

*Primary Examiner* — Mujtaba M Chaudry
(74) *Attorney, Agent, or Firm* — Vierra Magen Marcus LLP

(57) ABSTRACT

A black box recorder for an autonomous vehicle includes an interface configured to receive data from an engine control unit (ECU) device. The data includes first data and second data. The black box recorder further includes an error correction code (ECC) engine configured to determine a first parity size associated with the first data based on a characteristic of the first data and a second parity size associated with the second data based on a characteristic of the second data. The first parity size is different than the second parity size. The ECC engine is further configured to generate a convolutional low-density parity-check (CLDPC) codeword that includes the first data, the second data, first redundancy data associated with the first data, and second redundancy data associated with the second data. The first redundancy data has the first parity size, and the second redundancy data has the second parity size.

25 Claims, 5 Drawing Sheets

(51) Int. Cl.
*H03M 13/11* (2006.01)
*B60R 16/023* (2006.01)
*H03M 13/29* (2006.01)

(56) References Cited

U.S. PATENT DOCUMENTS

| | | | |
|---|---|---|---|
| 7,227,797 B2* | 6/2007 | Thayer | G06F 11/1044 365/200 |
| 8,549,384 B1 | 10/2013 | Huang et al. | |
| 8,645,789 B2 | 2/2014 | Sharon et al. | |
| 8,924,815 B2 | 12/2014 | Frayer et al. | |
| 9,032,269 B2 | 5/2015 | Sharon et al. | |
| 2007/0204067 A1* | 8/2007 | Walker | H04N 19/196 709/247 |
| 2009/0125764 A1 | 5/2009 | Sung et al. | |
| 2013/0132804 A1* | 5/2013 | Frayer | G06F 11/1012 714/780 |
| 2013/0145238 A1 | 6/2013 | Alhussien et al. | |
| 2014/0173382 A1 | 6/2014 | Yang et al. | |
| 2015/0155967 A1* | 6/2015 | Kim | H04L 1/0042 375/295 |
| 2017/0123898 A1 | 5/2017 | Ryabinin et al. | |
| 2017/0123902 A1 | 5/2017 | Ravimohan et al. | |
| 2017/0257117 A1 | 9/2017 | Goldenberg et al. | |
| 2017/0257118 A1 | 9/2017 | Goldenberg et al. | |
| 2017/0272102 A1 | 9/2017 | Goldenberg et al. | |

OTHER PUBLICATIONS

Felstrom et al., Time-varying Periodic Convolutional Codes with Low-density Parity-check Matrix, IEEE Transactions on Information Theory, vol. 45, No. 6, Sep. 1999, pp. 2181-2191.

Iyengar et al., "Windowed Decoding of Protograph-based LDPC Convolutional Codes over Erasure Channels", IEEE Transactions on Information Theory, vol. 58, No. 4, Apr. 2012, 18 pages.

Kudekar et al., "Threshold Saturation via Spatial Coupling: Why Convolutional LDPC Ensembles Perform So Well over the BEC", IEEE Transactions on Information Theory, vol. 57, No. 2, Feb. 2011, 29 pages.

Lentmaier et al., "Iterative Decoding Threshold Analysis for LDPC Convolutional Codes," IEEE Transactions on Information Theory, vol. 56, No. 10, Oct. 2010, pp. 5274-5289.

* cited by examiner

VARIABLE LENGTH CLDPC ENCODER AND METHOD OF OPERATION IN AN AUTONOMOUS VEHICLE

FIELD OF THE DISCLOSURE

The present disclosure is generally related to electronic devices and more particularly to error correction code (ECC) encoders of electronic devices.

BACKGROUND

Storage devices enable users to store and retrieve data. Examples of storage devices include volatile memory devices and non-volatile memory devices. A non-volatile memory may retain data after a power-down event, and a volatile memory may lose data after a power-down event.

Data written to and read from a storage device may be subject to one or more errors. For example, electronic noise may affect a storage element of a storage device and may cause the storage element to indicate an "incorrect" state.

Storage devices may use error correction coding (ECC) techniques to increase reliability of stored data. For example, an ECC technique may specify that redundancy information is to be added to data to generate a codeword prior to storing the data at a memory. During a read process to read the data, the redundancy information may be used to correct one or more errors of the codeword (up to an error correction capability associated with the ECC technique).

A particular ECC technique may be selected based on the particular implementation (or "use case") associated with a data storage device. For example, to increase data throughput, a relatively "short" code may be used.

In some implementations, a storage device may store multiple types of data associated with different characteristics. For example, data received from one particular source may be associated with a particular data size, error rate, or access rate, and data received from another particular source may be associated with another data size, error rate, or access rate. In this case, use of a common ECC technique for all of the data may be infeasible. Use of different ECC techniques may increase design cost or fabrication cost associated with the storage device.

DETAILED DESCRIPTION

Figure 1:
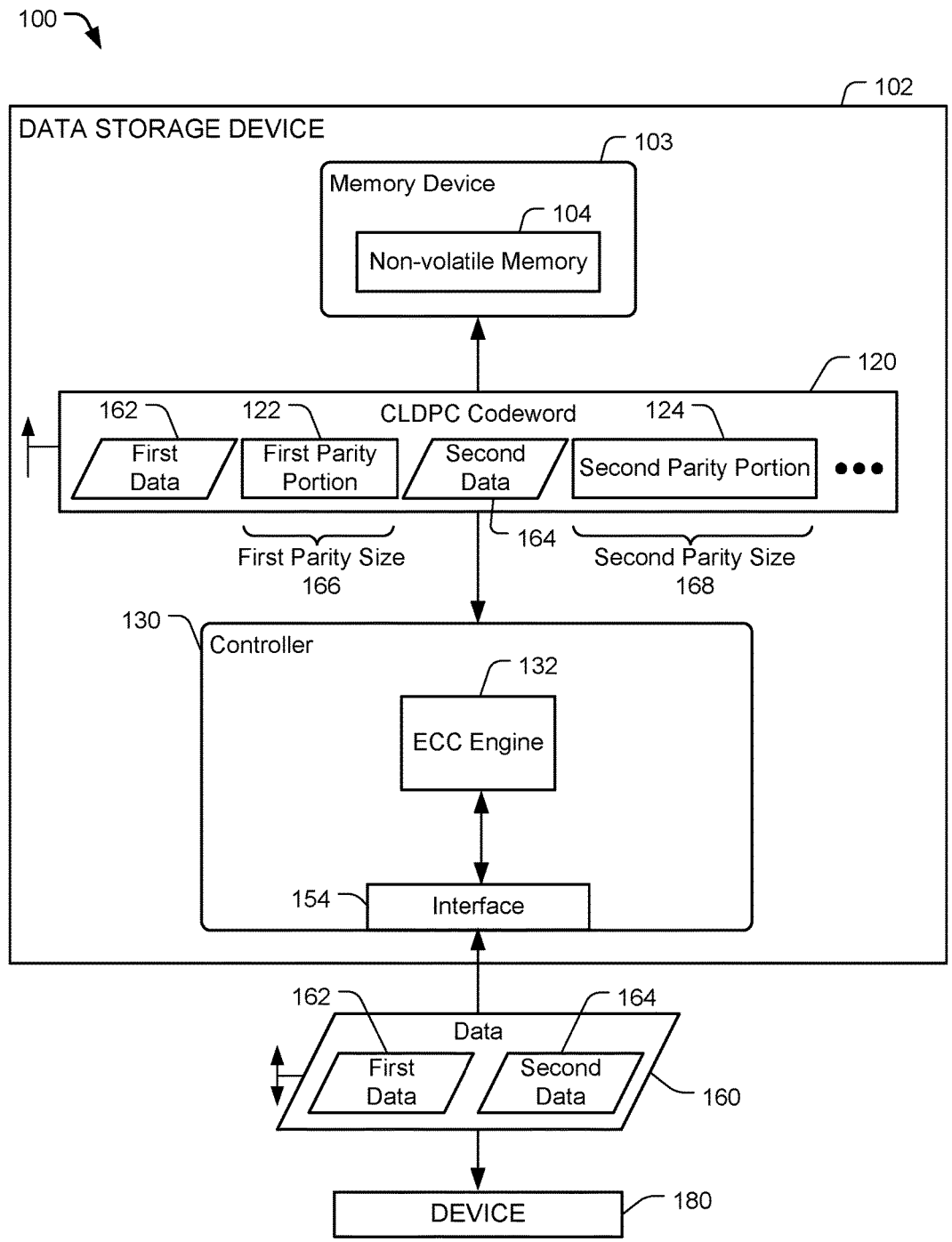
FIG. 1 is a diagram of a particular illustrative example of a system including a data storage device that is configured to encode data using a variable length convolutional low-density parity-check (CLDPC) code.

An encoder is configured to encode data using a convolutional low-density parity-check (CLDPC) code having a variable parity size. The encoder is configured to select a parity size (e.g., a number of parity bits) for data based on one or more criteria associated with the data. For example, the encoder may be configured to encode the data based on one or more of a source of the data or a priority associated with the data.

To illustrate, in a particular implementation, the encoder is included in a "black box" recorder of an autonomous vehicle (e.g., a "self-driving" car or a drone, a bus, a train, a plane, a boat, etc., as illustrative examples). The black box recorder may receive data from multiple sources, such as from multiple types of sensors of the autonomous vehicle. The encoder may allocate more parity bits for data received from a particular source associated with a higher error rate or a higher data rate (as compared to data from a source associated with a lower error rate or a lower data rate), as illustrative examples. In some circumstances, a parity size may be selected dynamically. For example, in response to detection of an emergency condition (e.g., rapid deceleration, airbag deployment, or low tire pressure), the parity size of data from one or more sensors may be increased prior to an accident or other event. In some examples, parity information allocated to "critical" data may be selectively increased as compared to less "critical" data, increasing storage efficiency.

In a particular example, the encoder is configured to encode data received from multiple sources into a CLDPC codeword using a pipelined encoding process. For example, the encoder may be configured to encode the data using a plurality of encoding windows that each include two or more sub-blocks of an encoding matrix (where each window corresponds to a stage of the pipeline). As a result, the CLDPC codeword may include "chunks" corresponding to different sources of the autonomous vehicle, and each "chunk" may be independently accessible and decodable.

In some implementations, data received at a "black box" recorder may be sequential, such as if the data includes sequential frames or samples. Further, a vehicle that includes the black box recorder may infrequently read the data from the black box recorder (e.g., in emergencies or for diagnostic purposes). Accordingly, a black box recorder in accordance with the disclosure may increase throughput or power consumption of encoding operations and storage operations as compared to read operations and decoding operations. As a non-limiting illustrative example, in some cases, a decoding operation may be performed "off-line" by a decoder that is external to the vehicle. Alternatively or in addition, a CLDPC code may be selected that increases encoding throughput or power consumption as compared to decoding throughput or power consumption. As a result, read throughput and read power consumption may be reduced while improving write throughput and write endurance, which may be advantageous in some applications, such as in the case of an autonomous vehicle.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Referring to FIG. 1, a particular illustrative example of system is depicted and generally designated 100. The system 100 includes a data storage device 102 and a device 180 (e.g., a host device or an access device). The data storage device 102 includes a memory device 103 and a controller 130. The controller 130 is coupled to the memory device 103.

The memory device 103 includes a non-volatile memory 104, such as a non-volatile array of storage elements included in one or more memory dies. The non-volatile memory 104 may include a flash memory (e.g., a NAND flash memory) or a resistive memory, such as a resistive random access memory (ReRAM), as illustrative examples.

The non-volatile memory 104 includes one or more regions of storage elements. An example of a storage region is a block, such as a NAND flash erase group of storage elements, or a group of resistance-based storage elements in a ReRAM implementation. Another example of a storage region is a word line of storage elements (e.g., a word line of NAND flash storage elements or a word line of resistance-based storage elements). A storage region may have a single-level-cell (SLC) configuration, a multi-level-cell (MLC) configuration, or a tri-level-cell (TLC) configuration, as illustrative examples. A storage element may be programmable to a state (e.g., a threshold voltage in a flash configuration or a resistive state in a resistive memory configuration) that indicates one or more values. As an example, in an illustrative TLC scheme, a storage element may be programmable to a state that indicates three values. As an additional example, in an illustrative MLC scheme, a storage element may be programmable to a state that indicates two values.

The controller 130 includes an error correction code (ECC) engine 132 and an interface 154 (e.g., a host interface or an access device interface). The interface 154 is configured to receive data 160 from the device 180 in connection with a request for write access to the non-volatile memory 104. The interface 154 is configured to provide the data 160 to the device 180 in connection with a request for read access to the non-volatile memory 104.

The ECC engine 132 is configured to operate based on a convolutional low-density parity-check (CLDPC) code. For example, the ECC engine 132 is configured to encode the data 160 based on a CLDPC code. A CLDPC code may also be referred to as a "spatially coupled" code.

During operation, the controller 130 may receive the data 160 from the device 180 via the interface 154. In the example of FIG. 1, the data 160 includes first data 162 and second data 164. The controller 130 is configured to input the data 160 to the ECC engine 132.

The controller 130 is configured to determine parity sizes associated with the first data 162 and the second data 164. In a particular example, the ECC engine 132 is configured to determine a first parity size 166 associated with the first data 162 and a second parity size 168 associated with the second data 164. The first parity size 166 is different than (i.e., greater than or less than) the second parity size 168.

The ECC engine 132 is configured to generate a convolutional low-density parity-check (CLDPC) codeword 120 that includes the first data 162, the second data 164, first redundancy data (e.g., a first parity portion 122), and second redundancy data (e.g., a second parity portion 124). The first parity portion 122 is associated with the first data 162 and has the first parity size 166, and the second parity portion 124 is associated with the second data 164 and has the second parity size 168.

In some implementations, the controller 130 is configured to determine the parity sizes 166, 168 based on one or more criteria associated with the data 160. For example, in some implementations, the controller 130 is configured to determine the parity sizes 166, 168 based on one or more of sensor types associated with the data 162, 164 or priorities associated with the data 162, 164, as described further with reference to FIG. 2.

The controller 130 is configured to send the CLDPC codeword 120 to the memory device 103. The memory device 103 is configured to receive the CLDPC codeword 120 and to store the CLDPC codeword 120 at the non-volatile memory 104.

One or more aspects described with reference to FIG. 1 may improve performance of a data storage device 102. For example, selection of a parity size for data may increase efficiency of storage usage (e.g., by increasing an amount of parity allocated to higher priority data), as described further with reference to FIG. 2.

Figure 2:
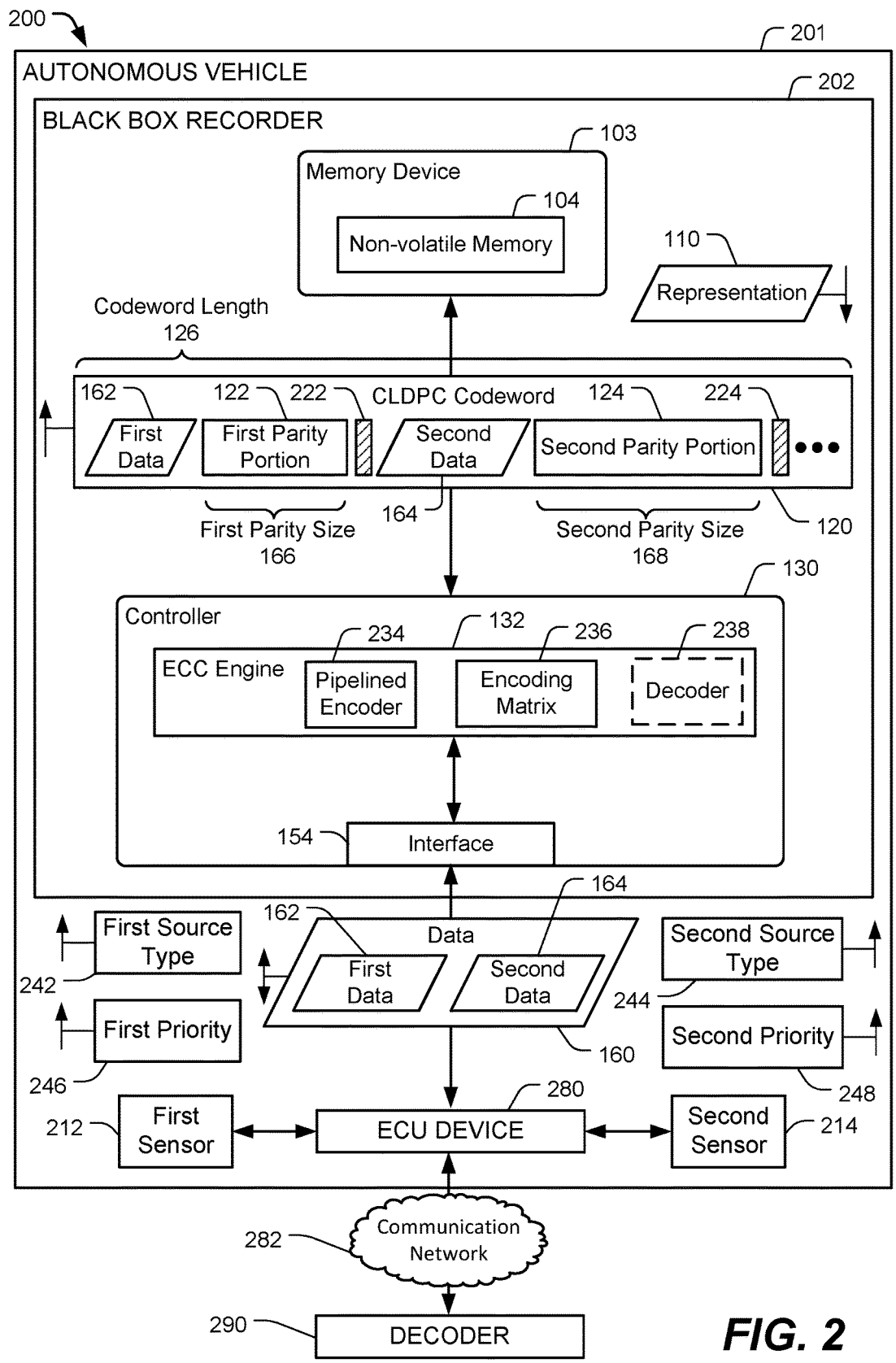
FIG. 2 is a diagram of a particular illustrative example of a system including an autonomous vehicle that includes the data storage device of FIG. 1.

Referring to FIG. 2, a particular illustrative example of system is depicted and generally designated 200. The system 200 includes an autonomous vehicle 201 (e.g., a "self-driving" car or a drone, as illustrative examples). In the example of FIG. 2, the autonomous vehicle includes a "black box" recorder 202 and an engine control unit (ECU) device 280. In a particular example, the black box recorder 202 includes or corresponds to the data storage device 102 of FIG. 1, and the ECU device 280 corresponds to or is included in the device 180 of FIG. 1. In FIG. 2, the memory device 103 and the controller 130 are integrated within the black box recorder 202.

The black box recorder 202 is coupled to the ECU device 280 by one or more connections. As an illustrative example, the black box recorder 202 may be coupled to the ECU device 280 via a vehicle bus, such as a bus configured to communicate using a controller area network (CAN) protocol.

The autonomous vehicle 201 further includes a plurality of sensors coupled to the ECU device 280. In the example of FIG. 2, the autonomous vehicle 201 includes a first sensor 212 and a second sensor 214 that are coupled to the ECU device 280. Although the example of FIG. 2 depicts two sensors, in other examples, the autonomous vehicle 201 may include a different number of sensors (e.g., one sensor, three sensors, or four sensors, as illustrative examples).

FIG. 2 also illustrates that the ECC engine 132 includes one or more encoders, such as a pipelined encoder 234. The pipelined encoder 234 is configured to encode the data 160 according to a pipelined encoding process to generate the CLDPC codeword 120. For example, the pipelined encoder 234 may be configured to encode the data 160 using an encoding matrix 236 (e.g., a generator matrix) to generate the CLDPC codeword 120.

The ECC engine 132 may include one or more decoders, such as a decoder 238. The decoder 238 is configured to decode data retrieved from the non-volatile memory 104. For example, the decoder 238 may be configured to decode data retrieved from the non-volatile memory 104 using a parity check matrix associated with the encoding matrix 236.

The system 200 may further include a decoder 290. The decoder 290 may be configured to communicate with the autonomous vehicle 201 using a communication network 282 (e.g., a wired communication network or a wireless communication network). For example, the decoder 290 may be included in a "cloud" computing device that communicates with the autonomous vehicle 201 using the communication network 282 (e.g., to perform a diagnostic test, another operation, or a combination thereof). Alternatively or in addition, the decoder 290 may be included in a device that communicates with the autonomous vehicle 201 using a wired network. In this case, the communication network 282 may include a wired communication network, such as an on-board diagnostic (OBD) port of the autonomous vehicle, as an illustrative example.

During operation, the autonomous vehicle 201 may generate the data 160. In a particular illustrative example, the first sensor 212 is configured to generate the first data 162 and to provide the first data 162 to the ECU device 280. The second sensor 214 may be configured to generate the second data 164 and to provide the second data 164 to the ECU device 280. The ECU device 280 may be configured to receive the data 160 from a plurality of sensors that includes the sensors 212, 214, and the black box recorder 202 may be configured to receive the data 160 from the ECU device 280.

In a particular example, the ECC engine 132 is configured to determine the first parity size 166 based on a characteristic associated with the first data 162 and to determine the second parity size 168 based on a second characteristic associated with the second data 164. For example, the characteristic of the first data 162 and the characteristic of the second data 164 may relate to a priority of the data 160 based on one or more operational states of the autonomous vehicle 201. The one or more operational states may include an emergency state of operation of the autonomous vehicle 201, as an illustrative example. Alternatively or in addition, the characteristic of the first data 162 and the characteristic of the second data 164 may relate to a type of sensors within the autonomous vehicle 201 generating the first data 162 and the second data 164.

To further illustrate, in an illustrative example, the controller 130 is configured to receive an indication of a first source type 242 associated with the first data 162 from the ECU device 280 in connection with receiving the first data 162 from the ECU device 280. The controller 130 may be configured to receive an indication of a second source type 244 associated with the second data 164 from the ECU device 280 in connection with receiving the second data 164 from the ECU device 280. As a non-limiting illustrative example, the first source type 242 may indicate that the first data 162 is generated by a camera of the autonomous vehicle 201, an OBD system of the autonomous vehicle 201, a navigation system of the autonomous vehicle 201, a powertrain sensor of the autonomous vehicle 201, or another device. As another non-limiting illustrative example, the second source type 244 may indicate that the second data 164 is generated by a camera of the autonomous vehicle 201, an OBD system of the autonomous vehicle 201, a navigation system of the autonomous vehicle 201, a powertrain sensor of the autonomous vehicle 201, or another device.

In a particular example, the ECC engine 132 is configured to encode the data 160 based on the source types 242, 244. As an illustrative example, the first source type 242 may indicate that the first data 162 is associated with a higher data rate as compared to the second data 164. In this case, the ECC engine may allocate a greater amount of parity information to the first data 162 as compared to the second data 164 (e.g., so that the first parity size 166 is greater than the second parity size 168).

Alternatively or in addition, the controller 130 may be configured to receive an indication of a first priority 246 associated with the first data 162 from the ECU device 280 in connection with receiving the first data 162 from the ECU device 280. The controller 130 may be configured to receive an indication of a second priority 248 associated with the second data 164 from the ECU device 280 in connection with receiving the second data 164 from the ECU device 280. To illustrate, the ECU device 280 may be configured to indicate that certain data is to receive a greater amount of parity information as compared to other data. As an illustrative example, the ECU device 280 may be configured to detect data indicative of an emergency condition (e.g., rapid deceleration, airbag deployment, or low tire pressure). In this case, the data may be indicated as having higher priority than other data, and the ECC engine 132 may allocate a greater parity size to the data. As an illustrative example, the first priority 246 may be greater than the second priority 248, and the ECC engine 132 may allocate a greater amount of parity information to the first data 162 as compared to the second data 164 (e.g., so that the first parity size 166 is greater than the second parity size 168) to increase an error correcting capability associated with decoding of the first data 162.

The ECC engine 132 may be configured to determine a codeword length 126 of the CLDPC codeword 120. For example, by determining the parity sizes 166, 168, the ECC engine 132 may determine the codeword length 126. Alternatively or in addition, the ECC engine 132 may be configured to determine the parity sizes 166, 168 based on one or more of a "maximum" length of the CLDPC codeword 120 or a "minimum" length of the CLDPC codeword 120. In this example, the ECC engine 132 may adjust one or more of the parity sizes 166, 168 based on the codeword length 126, such as by increasing one or more of the parity sizes 166, 168 so that the codeword length 126 satisfies a "minimum" length or by decreasing one or more of the parity sizes 166, 168 so that the codeword length 126 satisfies a "maximum" length.

The pipelined encoder 234 is configured to encode the data 160 using a pipelined encoding process to generate the CLDPC codeword 120. In a particular example, the pipelined encoder 234 is configured to encode the data 160 using a first window of the encoding matrix 236 and using a second window of the encoding matrix 236, as described further with reference to FIG. 5.

In some implementations, the ECC engine 132 is configured to generate first error detection information 222 associated with the first data 162 and to generate second error detection information 224 associated with the second data 164. For example, the first error detection information 222 may include a first cyclic redundancy check (CRC) associated with the first data 162 (or associated with the first data 162 and the first parity portion 122). As another example, the second error detection information 224 may include a second CRC associated with the second data 164 (or associated with the second data 164 and the second parity portion 124). In the example of FIG. 2, the CLDPC codeword 120 includes the error detection information 222, 224.

The controller 130 is configured to send the CLDPC codeword 120 to the memory device 103. The memory device 103 is configured to receive the CLDPC codeword 120 and to store the CLDPC codeword 120 at the non-volatile memory 104. The memory device 103 may store the CLDPC codeword 120 at one or more storage regions of the non-volatile memory 104, such as at a word line group of storage elements of the non-volatile memory 104, as an illustrative example.

The memory device 103 is configured to sense one or more portions of the CLDPC codeword 120 to generate a representation 110 of one or more portions of the CLDPC codeword 120. To illustrate, in some cases, the ECU device 280 may request one or more portions of the CLDPC codeword 120 from the black box recorder 202, such as in connection with a diagnostic process, as an illustrative example. Alternatively or in addition, another device may request one or more portions of the CLDPC codeword 120 via the communication network 282. In some cases, the representation 110 may differ from the CLDPC codeword 120 due to one or more bit errors.

To further illustrate, in some cases, a device may request certain data from the black box recorder 202, such as by requesting data associated with one or more particular sensors of the autonomous vehicle 201. The controller 130 may be configured to receive a request that identifies the one or more particular sensors, such as by indicating index values associated with the particular sensors. In a particular example, the controller 130 is configured to store information (e.g., a lookup table) associating the index values with particular portions of the CLDPC codeword 120. For example, an index value of zero may be associated with a first "chunk" of the CLDPC codeword 120, such as the first data 162. As another example, an index value of one may be associated with a second "chunk" of the CLDPC codeword 120, such as the second data 164. In some implementations, parity sizes of CLDPC codewords may be determined dynamically, such as on a codeword-by-codeword basis. In this case, another CLDPC codeword generated by the ECC engine 132 may have a different priority scheme. As an illustrative example, another CLDPC codeword generated by the ECC engine 132 may have a first "chunk" associated with the index value of one and a second "chunk" associated with the index value of zero.

The controller 130 is configured to send a command to the memory device 103 to generate the representation 110 of one or more portions of the CLDPC codeword 120. The memory device 103 is configured to sense one or more portions of the CLDPC codeword 120 to generate the representation 110. The memory device 103 is configured to send the representation 110 to the controller 130.

The controller 130 is configured to receive the representation 110 from the memory device 103. In some implementations, the ECC engine 132 is configured to decode the representation 110. For example, the controller 130 may provide the representation 110 to the decoder 238 to decode the representation 110 in accordance with a CLDPC code to correct one or more bit errors that may be present in the representation 110.

Alternatively or in addition, the controller 130 may provide the representation 110 to another device. For example, the controller 130 may provide the representation 110 to the decoder 290 (e.g., in response to a command received in connection with a diagnostic process, as an illustrative example). In this example, the ECC engine 132 may be configured to provide the representation 110 to the decoder 290 via the communication network 282 to initiate an "offline" decoding process. The decoder 290 may perform the "offline" decoding process in connection with a diagnostic test of the autonomous vehicle 201, as an illustrative example.

In a particular example, the decoder 238 is configured to perform a "partial" decode of the representation 110, and the decoder 290 is configured to perform a "full" decode of the representation 110. For example, the decoder 238 may be configured to selectively decode a portion of the representation 110 (e.g., a representation of the first data 162) using the first parity portion 122 and to verify (or "check") decoding of the first data 162 using the first error detection information 222 (e.g., to determine whether the decoded first data 162 has one or more bit errors). The decoder 238 may be configured to decode the representation of the first data 162 independently of the second data 164, the second parity portion 124, and the second error detection information 224.

Alternatively or in addition, the representation 110 may be provided to the decoder 290 (e.g., to initiate a "full" decode of the representation 110).

Although the examples of FIGS. 1 and 2 depict that the CLDPC codeword 120 includes two data portions (i.e., the first data 162 and the second data 164), it should be appreciated that the CLDPC codeword 120 may include three or more data portions. Further, data portions of the CLDPC codeword 120 may be received from three or more sensors.

In some implementations, determination of parity sizes may be performed dynamically. For example, in response to detection of an emergency condition (e.g., rapid deceleration, airbag deployment, or low tire pressure), the controller 130 may increase a parity size of data from one or more sensors prior to an accident or other event. In some examples, parity information allocated to "critical" data may be selectively increased as compared to less "critical" data.

One or more aspects described with reference to FIG. 2 may improve operation of an autonomous vehicle. For example, by selectively adjusting the parity sizes 166, 168, more parity information may be allocated to higher priority data (e.g., without increasing parity information allocated to lower priority data). As a result, storage efficiency is increased.

Figure 3:
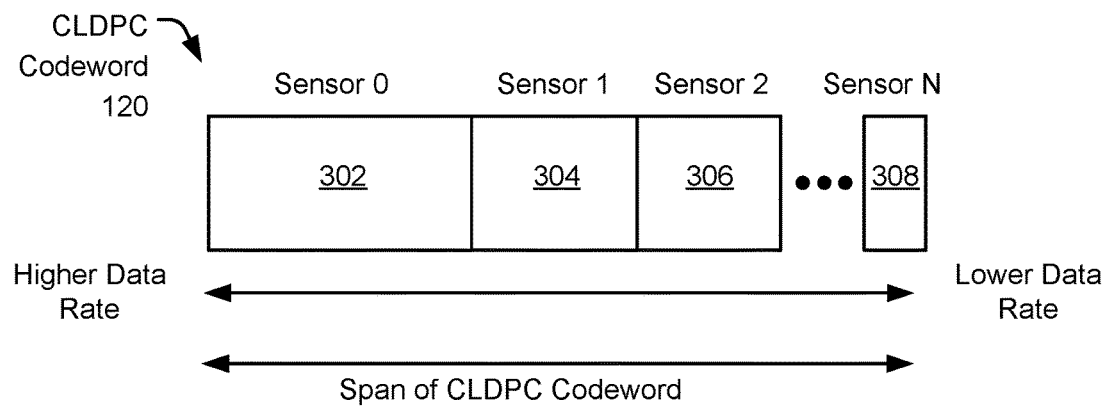
FIG. 3 is a diagram illustrating particular aspects of an example of an encoding scheme that may be used by the data storage device of FIG. 1.

FIG. 3 is a diagram illustrating particular aspects of an example of an encoding scheme. The encoding scheme illustrated in FIG. 3 may be used by the data storage device 102 of FIG. 1, by the black box recorder 202 of FIG. 2, by another device, or a combination thereof.

In the example of FIG. 3, different portions (or "chunks") of the CLDPC codeword 120 are associated with different sensors. For example, in FIG. 3, the CLDPC codeword 120 includes a portion 302 associated with sensor 0 (e.g., the first sensor 212 or another sensor) and further includes a portion 304 associated with sensor 1 (e.g., the second sensor 214 or another sensor). FIG. 3 also illustrates that the CLDPC codeword 120 may include a portion 306 associated with sensor 2 and may further include a portion 308 associated with sensor N (where N indicates a positive integer greater than three).

Each of the portions 302, 304, 306, and 308 may include data and parity information associated with the data. In a particular example, the portion 302 includes the first data 162 and the first parity portion 122, and the portion 304 includes the second data 164 and the second parity portion 124. In some implementations, the portion 302 further includes the first error detection information 222, and the portion 304 further includes the second error detection information 224.

Each sensor may be associated with a particular data rate (e.g., a particular number of samples per second). As a particular example, sensor 0 is associated with a greater data rate as compared to sensor 1. FIG. 3 also depicts that sensor 1 may be associated with a greater data rate as compared to sensor 2, and sensor 2 may be associated with a greater data rate as compared to sensor N.

In a particular example, the ECC engine 132 is configured to encode data from each sensor described with reference to FIG. 3 using a common code rate. The code rate may correspond to k/n, where k indicates a number of data bits of a particular portion of the CLDPC codeword 120, where n indicates a number of data bits of the particular portion, and n-k indicates the parity size of the particular portion. In this example, data received from a sensor associated with a greater data rate will be encoded with a greater number of parity bits as compared to data received from a sensor associated with a lower data rate. As an example, the first parity size 166 of the first parity portion 122 may be greater than the second parity size 168 if the first data 162 includes more bits than the second data 164 as a result of the first sensor 212 using a greater data rate than the second sensor 214.

The example of FIG. 3 illustrates that parity sizes of portions of the CLDPC codeword 120 may vary depending on sensor data rates. For example, a larger "chunk" of the CLDPC codeword 120 may be allocated to a sensor with a larger data rate, and a smaller "chunk" of the CLDPC codeword 120 may be allocated to a sensor with a smaller data rate while using a common code rate to encode data from the sensors.

Figure 4:
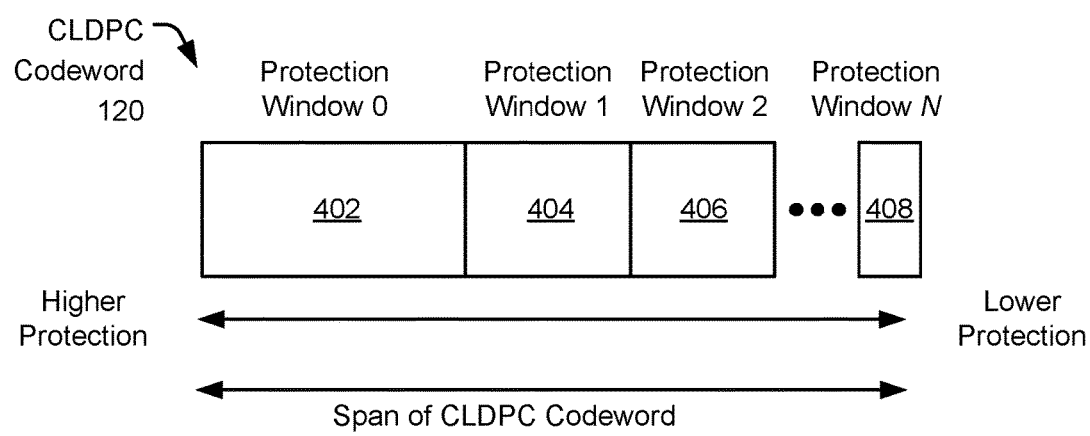
FIG. 4 is a diagram illustrating particular aspects of another example of an encoding scheme that may be used by the data storage device of FIG. 1.

FIG. 4 is a diagram illustrating particular aspects of an example of an encoding scheme. The encoding scheme illustrated in FIG. 4 may be used by the data storage device 102 of FIG. 1, by the black box recorder 202 of FIG. 2, by another device, or a combination thereof.

In the example of FIG. 4, different portions (or "chunks") of the CLDPC codeword 120 are associated with protection windows. For example, in FIG. 4, the CLDPC codeword 120 includes a portion 402 associated with protection window 0 and further includes a portion 404 associated with protection window 1. FIG. 4 also illustrates that the CLDPC codeword 120 may include a portion 406 associated with protection window 2 and may further include a portion 408 associated with sensor N (where N indicates a positive integer greater than two).

Each of the portions 402, 404, 406, and 408 may include data and parity information associated with the data. In a particular example, the portion 402 includes the first data 162 and the first parity portion 122, and the portion 404 includes the second data 164 and the second parity portion 124. In some implementations, the portion 402 further includes the first error detection information 222, and the portion 304 further includes the second error detection information 224.

In connection with the example of FIG. 4, data may be assigned a particular protection window of the CLDPC codeword 120 based on a priority of the data. As an example, the first data 162 may be assigned to the protection window 0 based on the indication of the first priority 246. As another example, the second data 164 may be assigned to the protection window 1 based on the indication of the second priority 248. In this case, the second data 164 may be of a lower priority than the first data 162, and the first data 162 may receive increased protection (e.g., a larger number of parity bits) as compared to the second data 164 (where the first parity size 166 is greater than the second parity size 168). In this example, data groups (e.g., where the first data 162 corresponds to a first data group and the second data 164 corresponds to a second data group) assigned to protection windows of the CLDPC codeword 120 may have a common data size (e.g., a common frame size) so that each data group may be assigned to a particular protection window. In other examples, the data groups may have different sizes. For example, the data groups may have different sizes, and each data group may be assigned to a protection window based on the particular data size of the data group.

The example of FIG. 4 illustrates that parity sizes of portions of the CLDPC codeword 120 may vary depending on priority of data. For example, a larger protection window of the CLDPC codeword 120 may be allocated to data with a greater priority, and a smaller protection window of the CLDPC codeword 120 may be allocated to data having a lower priority.

Figure 5:
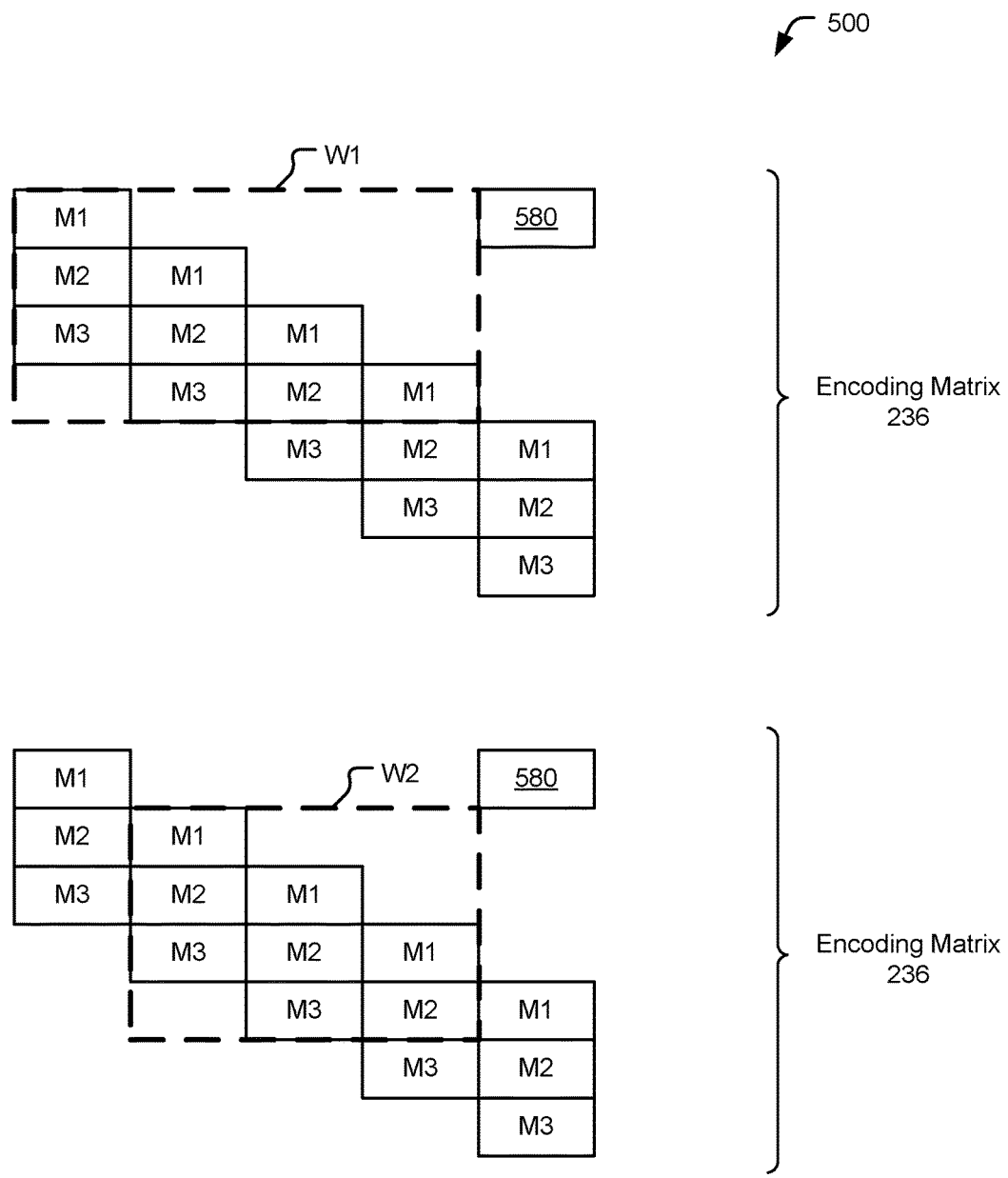
FIG. 5 is a diagram illustrating particular aspects of an example of a windowed encoding process that may be used by the data storage device of FIG. 1.

FIG. 5 illustrates particular aspects of an example of a windowed encoding process 500. The windowed encoding process 500 may be used to encode data by the data storage device 102 of FIG. 1, by the black box recorder 202 of FIG. 2, by another device, or a combination thereof.

The windowed encoding process 500 is performed using the encoding matrix 236. In the example of FIG. 5, the encoding matrix 236 includes a plurality of copies of a sub-matrix. In the example of FIG. 5, the sub-matrix includes matrices M1, M2, and M3. Each sub-matrix (M1, M2, . . . M3) may correspond to a distinct CLDPC code. Although three sub-matrices are illustrated, in other examples, a different number of sub-matrices may be used (e.g., more than three sub-matrices).

In FIG. 5, unlabeled portions of the encoding matrix 236 (i.e., portions not labeled M1, M2, or M3) may correspond to zero values. To illustrate, FIG. 5 depicts that the encoding matrix 236 includes a sub-matrix of zero values 580. The zero values 580 may enable a first set of values of the CLDPC codeword 120 to be decodable independently of a second set of values of the CLDPC codeword 120 (e.g., if the first set of values does not participate in parity check equations associated with the second set of values).

The pipelined encoder 234 of FIG. 2 is configured to encode data (e.g., the data 160) using a first window W1 of the encoding matrix 236 and using a second window W2 of the encoding matrix 236 during performance of the pipelined encoding process 500. The first window W1 may correspond to a first subset of rows and columns of the encoding matrix 236, and the pipelined encoder 234 may adjust (e.g., move or "slide") the first window W1 to create the second window W2 (and to select another subset of rows and columns of the encoding matrix 236).

In an illustrative example, the pipelined encoder 234 is configured to encode a first data portion of the data 160 (e.g., the first data 162) in connection with a first encoding operation that uses the first window W1. The pipelined encoder 234 may be configured to perform a second encoding operation based on the second window W2 using a second data portion of the data 160 (e.g., the second data 164). In a particular example, the first encoding operation may be performed to generate the portion 302 or the portion 402 of the CLDPC codeword 120, and the second encoding operation may be performed to generate the portion 304 or the portion 404 of the CLDPC codeword 120.

The example of FIG. 5 illustrates that the first window W1 may have a different size than the second window W2 to enable encoding of data having different parity sizes. For example, the first window W1 may include a first number of columns of the encoding matrix 236, and the second window W2 may include a second number of columns of the encoding matrix 236 that is less than the first number. As a non-limiting illustrative example, the first window W1 may include 4 sub-matrices of the encoding matrix 236, and the second window W2 may include 3 sub-matrices of the encoding matrix 236 (where each sub-matrix includes M1, M2, . . . M3), as illustrated in the example of FIG. 5. In other examples, one or both of the windows W1, W2 may include a different number of rows or columns than illustrated in the example of FIG. 5.

During operation, the controller 130 may select priority windows, such as the windows W1 and W2. For example, the controller 130 may select one or more of the priority windows based on one or more of the indication of the first source type 242 or the indication of the second source type 244. As another example, the controller 130 may select one or more of the priority windows based on one or more the indication of the first priority 246 or the indication of the second priority 248.

In some implementations, the controller 130 may send portions of the CLDPC codeword 120 to the memory device using a pipelined technique. For example, the pipelined encoder 234 may complete a particular iteration of the pipelined encoding process 500 (e.g., a first iteration that uses the first window W1) to generate a portion of the CLDPC codeword 120 and may provide the portion to the memory device 103 prior to providing or generating one or more other portions of the CLDPC codeword 120. As an illustrative example, the controller 130 may send the portion 302 or the portion 402 to the non-volatile memory 104. After performing the first iteration, the pipelined encoder 234 may initiate another iteration of the pipelined encoding process 500 (e.g., a second iteration that uses the second window W2) to generate another portion of the CLDPC codeword, such as the portion 304 or the portion 404. Alternatively, the controller 130 may send portions of the CLDPC codeword 120 to the memory device 103 concurrently.

By using the pipelined encoding process 500, portions of a CLDPC codeword (e.g., the CLDPC codeword 120) may be generated and sent to the memory device 103 using a pipelined technique, increasing efficiency. Alternatively or in addition, portions of the CLDPC codeword 120 may be independently decodable of each other. As a result, portions of the CLDPC codeword 120 may be decodable separately or in parallel, which may reduce usage of decoding resources, a number of cycles used to decode data, or both.

To further illustrate certain aspects of the disclosure, in some implementations, the ECC engine 132 corresponds to a variable length CLDPC engine for autonomous car black box applications. The variable length CLDPC engine may be configured to encode a very long codeword (e.g., a codeword of one megabyte or more), which may correspond to the CLDPC codeword 120. The codeword may be of fixed or variable length and thus may be associated with a relatively large correction capability. The variable length CLDPC engine may have a low complexity and high throughput to enable fast write performance for the black box.

An "offline" decoder (e.g., the decoder 290) may be implemented using a lab computer or an external server, and hence performance and size specifications of the offline decoder may be reduced (while maintaining a relatively high correction capability of the offline decoder). Because the offline decoder may be operated offline in the "lab," larger chunks of data that include multiple decoding windows may be decoded in parallel without increasing a size of the memory used for processing and storing intermediate calculated values internal to the black box recorder 202. Accordingly, in some implementations, portions of a CLDPC codeword (e.g., the portions 302-308 or the portions 402-408) may be encoded sequentially and may be decoded in parallel.

Alternatively or in addition to use of the offline decoder, the variable length CLDPC engine may include a decoder (e.g., the decoder 238) to enable access to data encoded by the variable length CLDPC engine, such as to enable the autonomous vehicle 201 to access the data for maintenance or statistics collection, as illustrative examples. In this case, the decoder may be relatively "small" (e.g., low power) to enable decoding of relatively small segments of encoded data. For example, to enable reading of data associated with a particular sensor, the decoder may decode a particular portion of the data, such as the portion 302 or the portion 402, as illustrative examples (e.g., without decoding other portions of the data). A correction capability of the decoder may be less than a correction capability of the offline decoder (e.g., where a number of errors of a particular CLDPC codeword correctable by the decoder 238 is less than a number of errors of the particular CLDPC codeword correctable by the decoder 290). A power consumption of the decoder may be less than a power consumption of the offline decoder (e.g., where power consumed by the decoder 238 is less than power consumed by the decoder 290).

An encoder (e.g., the pipelined encoder 234) may be of a smaller size and complexity as compared to encoders in other applications. For example, by using a pipelined encoding process (e.g., the pipelined encoding process 500), certain operations may be performed serially instead of in parallel. As a result, components of the encoder may be "reused" during encoding. The encoder may generate a relatively long codeword in relatively small parts using encoding windows (e.g., the windows W1 and W2 of FIG. 5). Use of a relatively long codeword may increase the correction capability of the code. In some implementations, the encoder may be configured to increase protection (e.g., by assigning more parity bits) to data from "critical" sensors in order to increase protection capability for "critical" data.

Further, encoding operations and/or decoding operations may be performed in any order. For example, encoding operations and/or decoding operations may begin from a "start" portion, such as the portion 302 or the portion 402. Alternatively, encoding operations and/or decoding operations may be begin from an "end" portion (e.g., the portion 308 or the portion 408) or from a "middle" portion (e.g., the portion 304, 306, 404, or 406). In a particular example, if particular portion of a codeword is difficult to decode (e.g., if the decode operation "times out" or results in an uncorrectable error), the codeword may be "broken down" into multiple portions that are decoded separately.

In order to enable the variable length of codes, cyclic redundancy check (CRC) values may be generated and inserted (or "planted") in a codeword during encoding to enable decoding and verification of individual portions of the codeword. For example, the CRC values may correspond to the first error detection information 222 and the second error detection information 224.

In some applications, a black box recorder of a vehicle may record a steady (or "constant") and predictable amount of sources that are of different importance and criteria (such as sampling data rate). In accordance with disclosure, a storage device receives "labeled" data from the host. For example, the data 160 may be "labeled" using information such as the indications of the source types 242, 244, the priorities 246, 248, other information, or a combination thereof.

Although two sensors 212, 214 have been described, in other implementations, a different number of sensors may be used. The sensors 212, 214 may include one or more of a camera (e.g., a rearview camera), a brake sensor, a speedometer, a global positioning system (GPS) device, a temperature sensor (e.g., an ambient temperature sensor, an engine coolant temperature sensor, an oil temperature sensor, a transmission fluid temperature sensor, or another temperature sensor), a throttle position sensor, a fuel sensor, or another sensor, as illustrative examples.

In some implementations, the CLDPC codeword 120 includes a header or metadata. For example, the CLDPC codeword 120 may include a "global" header of metadata that indicates characteristics of each portion of the CLDPC codeword 120. Alternatively or in addition, the CLDPC codeword 120 may include headers or metadata in multiple portions of the CLDPC codeword 120, such as in "subheaders" of the CLDPC codeword 120. A header or metadata may be used to access particular portions of the CLDPC codeword 120 (e.g., without decoding an entirety of the CLDPC codeword 120), such as by indicating a particular sensor associated with a portion of the CLDPC codeword 120, a priority associated with a particular portion of the CLDPC codeword 120, other information, or a combination thereof.

In some implementations, allocation of data to portions of the CLDPC codeword 120 may be performed dynamically. For example, in response to a failure condition, the device 180 or the ECU device 280 may assign particular data to a greater priority. In some implementations, one or more components of the system 100 or the system 200 may include an input buffer to temporarily store data until a particular "window" associated with the data is determined. For example, the controller 130 may include a buffer for storing the data 160 until other information is received, such as the indications of the source types 242, 244, the priorities 246, 248, other information, or a combination thereof.

Figure 6:
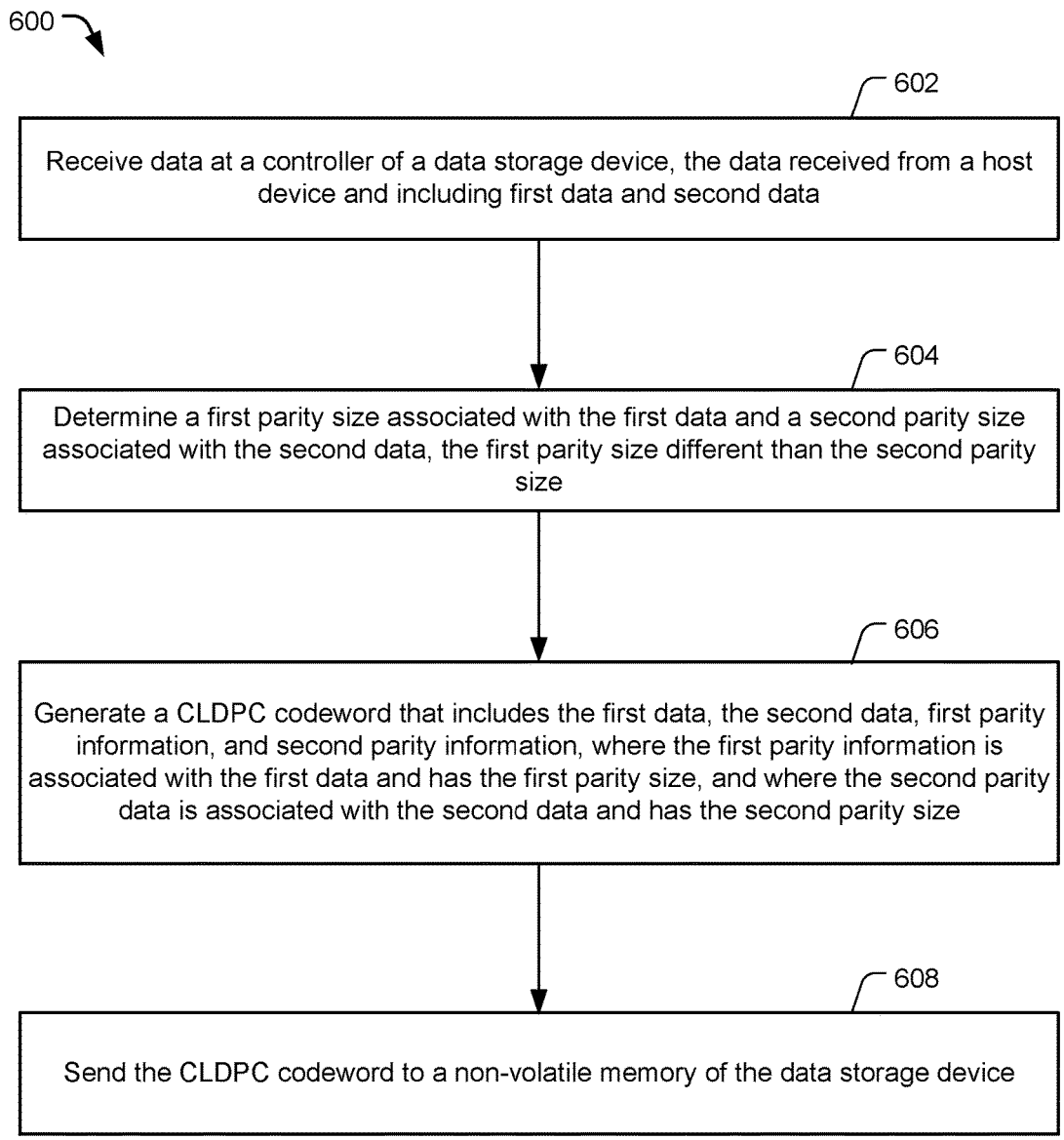
FIG. 6 is a flow chart of an illustrative example of a method of operation of the data storage device of FIG. 1.

FIG. 6 illustrates particular aspects of an example of a method 600. The method 600 may be performed by the data storage device 102 of FIG. 1, by the black box recorder 202 of FIG. 2, by another device, or a combination thereof.

The method 600 includes receiving data at a controller of a data storage device, at 602. The data is received from a device and includes first data and second data. To illustrate, the controller 130 may receive the data 160 from the device 180. The data 160 includes the first data 162 and the second data 164.

The method 600 further includes determining a first parity size associated with the first data and a second parity size associated with the second data, at 604. The first parity size is different than the second parity size. To illustrate, the controller 130 may determine the first parity size 166 and the second parity size 168. The first parity size 166 is different than the second parity size 168.

The method 600 further includes generating a CLDPC codeword that includes the first data, the second data, first parity information, and second parity information, at 606. The first parity information is associated with the first data and has the first parity size, and the second parity information is associated with the second data and has the second parity size. To illustrate, the controller 130 may generate the CLDPC codeword 120. The CLDPC codeword 120 includes the first data 162, the first parity portion 122, the second data 164, and the second parity portion 124. The first parity portion 122 has the first parity size 166, and the second parity portion 124 has the second parity size 168.

The method 600 further includes sending the CLDPC codeword to a non-volatile memory of the data storage device, at 608. For example, the controller 130 may send the CLDPC codeword 120 to the memory device 103 for storage at the non-volatile memory 104. In some implementations, portions of the CLDPC codeword 120 may be sent separately to the memory device 103. As an example, the controller 130 may send the portion 302 to the memory device 103 prior to sending or generating one or more other portions of the CLDPC codeword 120, such as the portion 304. As another example, the controller 130 may send the portion 402 to the memory device 103 prior to sending or generating one or more other portions of the CLDPC codeword 120, such as the portion 404. Alternatively, the controller 130 may send portions of the CLDPC codeword 120 to the memory device 103 concurrently.

One or more aspects described with reference to FIG. 6 may improve performance of a data storage device 102. For example, use of the method 600 may enable selection of a parity size for data to increase efficiency of storage usage.

In conjunction with the disclosed embodiments, an apparatus includes means (e.g., the interface 154) for receiving data (e.g., the data 160) from a device (e.g., the device 180). The data includes first data (e.g., the first data 162) and second data (e.g., the second data 164). The apparatus further includes means (e.g., the ECC engine 132 or the pipelined encoder 234) for determining a first parity size (e.g., the first parity size 166) associated with the first data, for determining a second parity size (e.g., the second parity size 168) that is associated with the second data and that is different than the first parity size, and for generating a CLDPC codeword (e.g., the CLDPC codeword 120) that includes the first data, the second data, first redundancy data (e.g., the first parity portion 122), and second redundancy data (e.g., the second parity portion 124). The first redundancy data is associated with the first data and has the first parity size, and the second redundancy data is associated with the second data and has the second parity size.

Although various components depicted herein are illustrated as block components and described in general terms, such components may include one or more microprocessors, state machines, or other circuits configured to enable such components to perform one or more operations described herein. For example, certain aspects of the ECC engine 132 may represent physical components, such as hardware controllers, state machines, logic circuits, or other structures, to enable determination of parity sizes for data.

Alternatively or in addition, certain aspects described herein may be implemented using a microprocessor or microcontroller. In a particular embodiment, one or more aspects of the ECC engine 132 are implemented using a processor executing instructions (e.g., firmware). The instructions may be executable by the processor to determine a parity size. The processor may retrieve the instructions from the non-volatile memory 104. Alternatively or in addition, executable instructions that are executed by the processor may be stored at a separate memory location that is not part of the non-volatile memory 104, such as at a read-only memory (ROM) that may be included in the data storage device 102.

The data storage device 102 may be coupled to, attached to, or embedded within one or more accessing devices, such as within a housing of the device 180. For example, the data storage device 102 may be embedded within the device 180 in accordance with a Joint Electron Devices Engineering Council (JEDEC) Solid State Technology Association Universal Flash Storage (UFS) configuration. To further illustrate, the data storage device 102 may be integrated within an electronic device (e.g., the device 180), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 102 is implemented in a portable device configured to be selectively coupled to one or more external devices, such as a host device. For example, the data storage device 102 may be removable from the device 180 (i.e., "removably" coupled to the device 180). As an example, the data storage device 102 may be removably coupled to the device 180 in accordance with a removable universal serial bus (USB) configuration.

The device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 180 may communicate via a controller, which may enable the device 180 to communicate with the data storage device 102. The device 180 may operate in compliance with a JEDEC Solid State Technology Association industry specification, such as an embedded MultiMedia Card (eMMC) specification or a Universal Flash Storage (UFS) Host Controller Interface specification. The device 180 may operate in compliance with one or more other specifications, such as a Secure Digital (SD) Host Controller specification as an illustrative example. Alternatively, the device 180 may communicate with the data storage device 102 in accordance with another communication protocol. In some implementations, the data storage device 102 may be integrated within a network-accessible data storage system, such as an enterprise data system, an NAS system, or a cloud data storage system, as illustrative examples.

In some implementations, the data storage device 102 includes a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the device 180 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the device 180 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. The non-volatile memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A black box recorder for an autonomous vehicle, the black box recorder comprising:
    an interface configured to receive data from an engine control unit (ECU) device, the data including first data and second data; and
    an error correction code (ECC) engine configured to:
        determine:
            a first parity size associated with the first data based on a source or priority of the first data, and
            a second parity size associated with the second data based on a source or priority of the second data, the first parity size different than the second parity size, and
        generate a convolutional low-density parity-check (CLDPC) codeword that includes the first data, the second data, a first parity portion, and a second parity portion,
        wherein the first parity portion is associated with the first data and has the first parity size, and wherein the second parity portion is associated with the second data and has the second parity size.

2. The black box recorder of claim 1, wherein the source or priority of the first data and the source or priority of the second data relate to a priority of the data based on one or more operational states of the autonomous vehicle, the one or more operational states including an emergency state of operation.

3. The black box recorder of claim 1, wherein the source or priority of the first data and the source or priority of the second data relate to different types of sensors within the autonomous vehicle that are sources of the first data and the second data.

4. The black box recorder of claim 1, wherein the ECC engine is further configured to provide a representation of the CLDPC codeword to a decoder via a communication network to initiate an offline decoding process.

5. An autonomous vehicle comprising:
    the black box recorder and the ECU device of claim 1; and
    a plurality of sensors including at least a first sensor of a first sensor type configured to generate the first data and a second sensor of a second sensor type configured to generate the second data, the second sensor type different from the first sensor type, wherein the ECU device is configured to receive the data from the plurality of sensors and send the data including the first data and the second data to the black box recorder; and wherein the ECC engine is further configured to determine the first parity size and the second parity size from the first sensor type and the second sensor type.

6. A method comprising:

receiving data at a controller of a black box recorder of an autonomous vehicle, the data received from an engine control unit (ECU) device in the autonomous vehicle and including first data from a first sensor of a first sensor type in the autonomous vehicle and second data from a second sensor of a second sensor type in the autonomous vehicle;

determining a first parity size associated with the first data and a second parity size associated with the second data according to the first and second sensor types, the first sensor type different than the second sensor type, the first parity size different than the second parity size;

generating a convolutional low-density parity-check (CLDPC) codeword that includes the first data, the second data, first parity information, and second parity information, wherein the first parity information is associated with the first data and has the first parity size, and wherein the second parity information is associated with the second data and has the second parity size; and sending the CLDPC codeword to a non-volatile memory of the black box recorder of the autonomous vehicle.

7. The method of claim 6, wherein the first parity size and the second parity size are determined dynamically in response to a predetermined condition.

8. The method of claim 7 wherein the predetermined condition is an emergency condition including at least one of: rapid deceleration, airbag deployment, or low tire pressure.

9. The method of claim 8, wherein the first data is a critical data, the second data is less critical data and the first parity size is selectively increased compared with the second data in response to the emergency condition.

10. The method of claim 6, further comprising:
receiving a first priority associated with the first data; and
receiving a second priority associated with the second data.

11. The method of claim 10, wherein the first parity size is determined based on the first priority, and wherein the second parity size is determined based on the second priority.

12. The method of claim 6, further comprising determining a codeword length of the CLDPC codeword based on the data.

13. The method of claim 6, further comprising:
generating first error detection information associated with the first data; and
generating second error detection information associated with the second data,
wherein the CLDPC codeword further includes the first error detection information and the second error detection information.

14. The method of claim 6, further comprising:
receiving a representation of the CLDPC codeword from the non-volatile memory; and
providing the representation of the CLDPC codeword to a decoder.

15. The method of claim 14, wherein the decoder is included in black box recorder of the autonomous vehicle.

16. The method of claim 14, wherein the representation of the CLDPC codeword is provided to the decoder via a communication network to initiate an offline decoding process.

17. An apparatus comprising:
an interface configured to receive data from sensors in an autonomous vehicle, the data including first data generated by a first sensor of a first type in the autonomous vehicle and second data generated by a second sensor of a second type in the autonomous vehicle; and
an error correction code (ECC) engine configured to determine a first parity size associated with the first data and a second parity size associated with the second data according to the first and second sensor types, the first sensor type different than the second sensor type, the first parity size different than the second parity size, and to generate a convolutional low-density parity-check (CLDPC) codeword that includes the first data, the second data, a first parity portion, and a second parity portion, wherein the first parity portion is associated with the first data and has the first parity size, and wherein the second parity portion is associated with the second data and has the second parity size.

18. The apparatus of claim 17, wherein the ECC engine includes a pipelined encoder configured to encode the data using a pipelined encoding process.

19. The apparatus of claim 18, wherein the pipelined encoder is further configured to encode the data using a first window of an encoding matrix and using a second window of the encoding matrix.

20. The apparatus of claim 17, further wherein the autonomous vehicle includes a black box recorder, wherein the interface and the ECC engine are integrated within the black box recorder, and wherein the first data and the second data are received from an engine control unit (ECU) device of the autonomous vehicle.

21. The apparatus of claim 17, wherein the first sensor type is one of: a camera, a brake sensor, a speedometer, a global positioning system (GPS) device, a temperature sensor, a throttle position sensor, or a fuel sensor.

22. The apparatus of claim 21, wherein the second sensor type is one of: a camera, a brake sensor, a speedometer, a global positioning system (GPS) device, a temperature sensor, a throttle position sensor, or a fuel sensor, wherein the second sensor type is different from the first sensor type.

23. An apparatus comprising:
means for receiving data from sensors in an autonomous vehicle, the data including first data generated by a first sensor of a first type in the autonomous vehicle and second data generated by a second sensor of a second type in the autonomous vehicle; and
means for determining a first parity size associated with the first data, for determining a second parity size that is associated with the second data and that is different than the first parity size, and for generating a convolutional low-density parity-check (CLDPC) codeword that includes the first data, the second data, a first parity portion, and a second parity portion, wherein the first parity portion is associated with the first data and has the first parity size, and wherein the second parity portion is associated with the second data and has the second parity size, the first and second parity sizes determined according to the first and second sensor types.

24. The apparatus of claim 23, wherein the means for determining is configured to determine the first parity size and to determine the second parity size dynamically in response to a condition of the autonomous vehicle.

25. The apparatus of claim 23, wherein means for determining is configured to increase the first parity size based on a first priority associated with the first data without increasing the second parity size based on a second priority associated with the second data.

\* \* \* \* \*